United States Patent
Larcher et al.

(10) Patent No.: US 10,236,845 B2
(45) Date of Patent: Mar. 19, 2019

(54) ACTIVE TRANSFORMER, CORRESPONDING APPARATUS AND METHOD

(71) Applicant: STMicroelectronics S.r.l., Agrate Brianza (IT)

(72) Inventors: Luca Larcher, Scandiano (IT); Andrea Pallotta, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 80 days.

(21) Appl. No.: 15/363,633

(22) Filed: Nov. 29, 2016

(65) Prior Publication Data

US 2017/0338783 A1   Nov. 23, 2017

(30) Foreign Application Priority Data

May 18, 2016   (IT) .................. 102016000051022

(51) Int. Cl.
| | |
|---|---|
| H03F 3/60 | (2006.01) |
| H03F 3/21 | (2006.01) |
| H03F 3/26 | (2006.01) |
| H03F 3/45 | (2006.01) |
| H03F 1/56 | (2006.01) |
| H03F 3/195 | (2006.01) |
| H03F 3/213 | (2006.01) |

(52) U.S. Cl.
CPC ............ *H03F 3/602* (2013.01); *H03F 1/565* (2013.01); *H03F 3/195* (2013.01); *H03F 3/211* (2013.01); *H03F 3/213* (2013.01); *H03F 3/265* (2013.01); *H03F 3/45475* (2013.01); *H03F 3/604* (2013.01); *H03F 2200/405* (2013.01); *H03F 2200/451* (2013.01); *H03F 2200/534* (2013.01); *H03F 2200/537* (2013.01); *H03F 2200/541* (2013.01)

(58) Field of Classification Search
CPC ........................................................ H03F 3/602
USPC .......................................................... 330/286
See application file for complete search history.

(56) References Cited

U.S. PATENT DOCUMENTS

| | | | | |
|---|---|---|---|---|
| 5,789,996 | A | * | 8/1998 | Borodulin ................. H01P 5/12 333/117 |
| 7,471,153 | B2 | * | 12/2008 | Kee .......................... H03F 1/22 330/276 |
| 8,049,564 | B2 | | 11/2011 | Pallotta |

(Continued)

OTHER PUBLICATIONS

Pallotta et al.: "Millimeter-Wave 14dBm CMOS Power Amplifier with Input-Output Distributed transformers", CICC2010 (Custom Integrated Circuit Conference), San Jose, CA, Sep. 19-22, 2010, pp. 1-4.

(Continued)

*Primary Examiner* — Patricia T Nguyen
(74) *Attorney, Agent, or Firm* — Crowe & Dunlevy

(57) ABSTRACT

A distributed active transformer includes an input transformer set and an output transformer set. Active stages are coupled between a transformer in the input transformer set and a transformer in the output transformer set. The input and output transformer sets are each configured as a slab transformer. The input slab transformer includes a single primary slab and many secondary slabs. The output slab transformer includes many primary slabs and a single secondary slab.

13 Claims, 4 Drawing Sheets

(56) References Cited

U.S. PATENT DOCUMENTS

| | | | |
|---|---|---|---|
| 2011/0221522 A1* | 9/2011 | An | H03F 1/56 330/126 |
| 2012/0001692 A1* | 1/2012 | Komijani et al. | H03F 3/26 330/276 |
| 2012/0112835 A1* | 11/2012 | Comeau et al. | H03F 3/60 330/286 |
| 2013/0095895 A1* | 4/2013 | Asuri | H04B 1/0064 455/571 |
| 2013/0099864 A1* | 4/2013 | Kawai | H01P 5/10 330/273 |
| 2015/0214994 A1 | 7/2015 | Yeh et al. | |

OTHER PUBLICATIONS

Pfeiffer, et al.: "A 23-dBm 60-GHz Distributed Active Transformer in a Silicon Process Technology", IEEE Trans. Microw. Theory and Tech., vol. 55(5), pp. 857-865, 2007.

Aoki, at el.: "Distributed Active Transformer—A new Power-Combining and Impedance-Transformation Technique", IEEE Trans. on Microwave Theory and Techniques, vol. 50(1), pp. 316-331, 2002.

Leufker, et al., "A 60 GHz 24.5 dBm Wideband Distributed Active Transformer Power Amplifier on 250nm BiCMOS", GeMiC 2015.

IT Search Report and Written Opinion for IT Appl. No. 102016000051022 dated Jan. 27, 2017 (9 pages).

* cited by examiner

ACTIVE TRANSFORMER, CORRESPONDING APPARATUS AND METHOD

PRIORITY CLAIM

This application claims priority from Italian Application for Patent No. 102016000051022 filed May 18, 2016, the disclosure of which is incorporated by reference.

TECHNICAL FIELD

The description relates to active transformers. One or more embodiments may find use in a variety of applications such as, for example, radio frequency (RF) power amplifiers (PAs). Power amplifiers for use in the RF PA market, such as CMOS-based RF power amplifiers for mobile terminals, for example, in the E-band (81-86 GHz), may be exemplary of such applications.

BACKGROUND

Selecting a power amplifier architecture may represent a complex task, involving a judicious compromise of various factors such as, for example, area occupation, efficiency, reliability and maximum output power.

So-called double distributed active transformers (DDAT's) have been proposed for use, for example, in millimeter-wave power amplifiers.

Despite the continued activity in that area, the need is still felt for improved solutions which may facilitate, for example:

- delivering a high output power with a low-power supply, for example, by combining power from a plurality of active stages,
- overcoming voltage/current constraints due, for example, to transistor breakdown issues,
- reducing complexity of ultra-high frequency RF PA design, as possibly related to the electromagnetic (EM) domain, and
- overcoming the limitations due to the space occupied by spiral inductors and transformers.

SUMMARY

According to one or more embodiments, a double distributed active transformer (DDAT) is presented having the features set forth in the claims that follow.

One or more embodiments may also relate to corresponding apparatus: a power amplifier, for example, an integrated circuit—IC RF power amplifier for use in a mobile terminal, for instance, may be exemplary of such apparatus.

One or more embodiments may also relate to a corresponding method.

The claims are an integral part of the disclosure of one or more embodiments as provided herein.

In one or more embodiments, a "linear" double distributed active transformer (L-DDAT) may facilitate, for example:

- leveraging silicon-based technologies, especially as regards the capability of mitigating transistor breakdown issues, thus increasing the output power delivered,
- simplifying RF power amplifier and preamplifier circuits and the related design activity,
- providing an architecture which is compact and easy to integrate,
- targeting different power levels via a simple modular approach up to millimeter-wave frequencies, and
- reducing the power amplifier silicon chip area.

One or more embodiments may rely on a power combiner topology for reasons such as:

- making it easier to obtain a high output power at millimeter-wave frequencies by combining the outputs from multiple small power amplifier (so-called "micro" power amplifiers or uPA's): each individual uPA cell can be realized with transistors of smaller sizes, providing improved performance, for example, in terms of higher stable gain and transition frequency; also, such cells can be more easily matched to achieve simultaneously high gain (conjugate matching) and high output power (power matching), and
- a power combiner topology may reduce the load impedance at the output of each uPA cell and deliver a relatively high output power through a low voltage supply related to the low breakdown limits of, for example, high speed CMOS and BiCMOS technology.

BRIEF DESCRIPTION OF THE DRAWINGS

One or more embodiments will now be described, by way of example only, with reference to the annexed figures, wherein.

DETAILED DESCRIPTION

Figure 1:
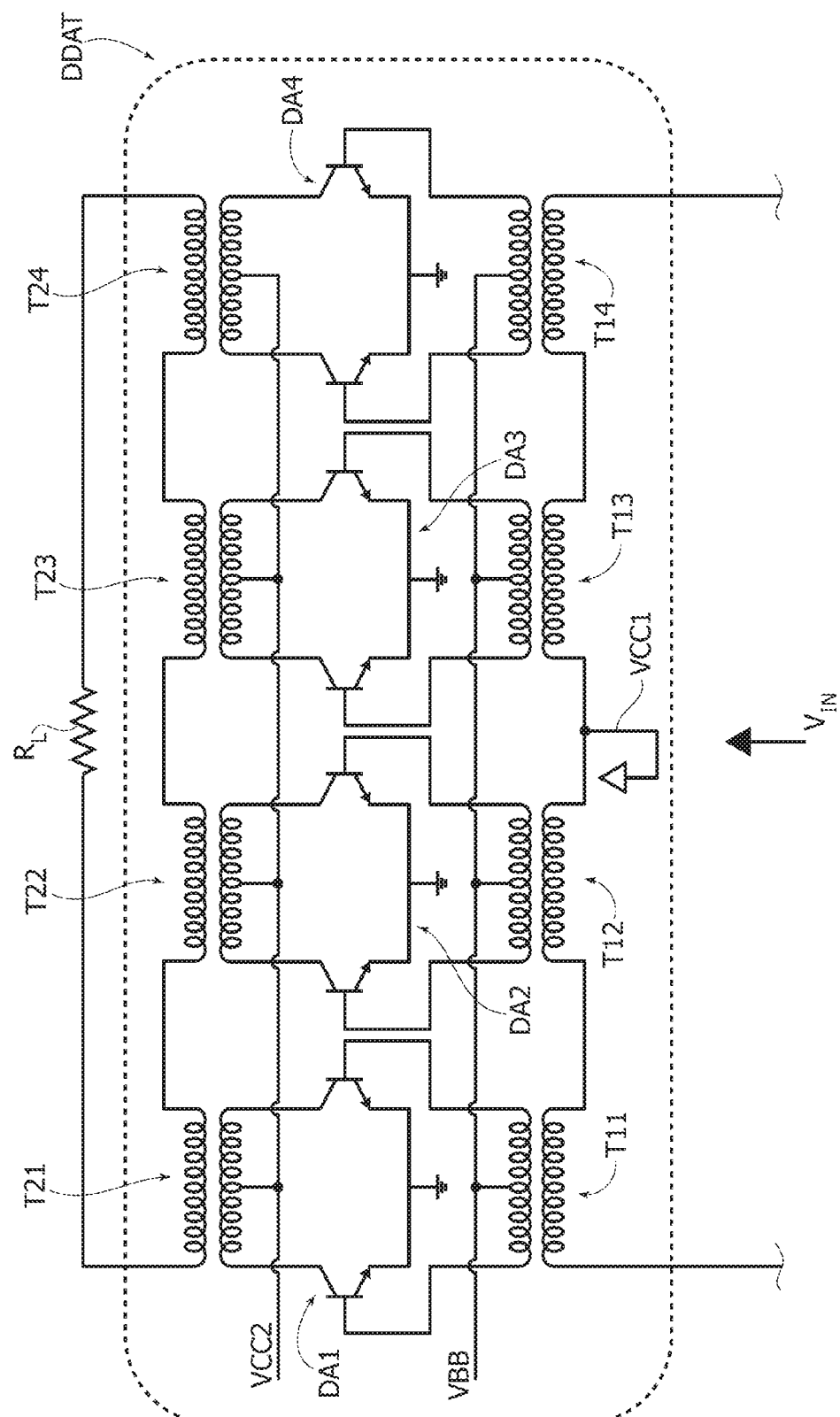
FIG. 1 is an exemplary circuit diagram of a double distributed active transformer.

In the ensuing description, one or more specific details are illustrated, aimed at providing an in-depth understanding of examples of embodiments of the present description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Several power combiner concepts exploiting transformers have been proposed in the literature, where transformer secondary outputs have been shown to be connected a load impedance in series, parallel and mixed modes.

The type of transformer connection may change the impedance seen by the output of each active stage (for example, MOSFET), while the output powers of the various elementary cells (for example, uPA's) may be combined and summed together by maintaining the voltage across them within the limits related to the low breakdown voltage of silicon-based technologies such as CMOS and BiCMOS.

For instance, in the case of series combination, the input impedance seen by the each single uPA cell may be reduced by a factor equal to the number of cells M, while the output power may be increased by a factor proportional to $M^2$. Also, transformer-based power combiner architectures facilitate making load impedance matching efficient, thus improving the overall performance of a power amplifier (PA).

The article by Aoki, et al.: "Distributed Active Transformer—A new Power-Combining and Impedance-Transformation Technique", IEEE Trans. on Microwave Theory and Techniques, vol. 50(1), pp. 316-331, 2002 (incorporated by reference), discloses a distributed active transformer (DAT) which allows simultaneously combining power and transforming load impedance to an adequate value for by each single uPA cell.

Despite the significant advantages of DAT-based power combining structures, feeding the input signal to each single uPA cell input with a minimum phase mismatch and without degrading overall PA stability may be a challenging issue and may require a large area: see, for example, Pfeiffer, et al.: "A 23-dBm 60-GHz Distributed Active Transformer in a Silicon Process Technology", IEEE Trans. Microw. Theory and Tech., vol. 55(5), pp. 857-865, 2007 (incorporated by reference).

U.S. Pat. No. 8,049,564 B1 (incorporated by reference) discloses a dual concentric DAT structure (Double Distributed Active Transformer—DDAT) which facilitates achieving improved PA stability, efficiency and minimum area consumption. Also, further details of the possible implementations of a double distributed active transformer layout may be gathered, for example, from Pallotta et al.: "Millimeter-Wave 14 dBm CMOS Power Amplifier with Input-Output Distributed transformers", CICC2010 (Custom Integrated Circuit Conference), San Jose, Calif., 19-22 Sep. 2010, pp. 1-4 (incorporated by reference).

FIG. 1 is an exemplary representation of a double distributed active transformer (DDAT) including a "fourfold" DDAT, wherein the primary and secondary windings of an elementary transformer structure are each split (that is, distributed) into four, with four input transformers T11, T12, T13, T14 each driving a respective output transformer T21, T22, T23, T24 via a respective active (amplifier) stage DA1, DA2, DA3, DA4.

As exemplified in FIG. 1, the primary side of a double distributed active transformer may include the cascaded (for example, series) arrangement of the primary windings of four transformers T11, T12, T13, T14, optionally with an intermediate tap point between the primary windings of T12 and T13 set to a voltage power supply for proper transistor collector biasing (VCC1). An input (for example, an input voltage $V_{IN}$) to the DDAT transformer may thus drive an input current into the primary windings of T11, T12, T13, T14.

In an arrangement as exemplified in FIG. 1, the secondary windings of the transformers T21, T22, T23, T24 may be cascaded (for example, series-coupled) to drive a load $R_L$. The load $R_L$ may thus be traversed by the current flowing through the secondary windings of the transformers T21, T22, T23, T24.

In the diagram of FIG. 1, VCC2 and VBB denote respective voltage power supplies coupled with intermediate points of the primary windings of T21, T22, T23, T24 and of the secondary windings of T11, T12, T13, T14, respectively.

The resulting power combination may lead to increasing the output power applied to the load $R_L$ by a factor of N, where N is the number of transformer elements resulting from splitting/distributing the primary and secondary windings of a basic transformer (for example, N=4 in FIG. 1).

Likewise, the output voltage on each active device (for example, transistor) may be divided by a factor of N, thus reducing breakdown stress.

A difficulty in DAT-based power amplifiers may lie in distributing a RF input signal to all the push-pull couples included in the DAT.

Figure 2:
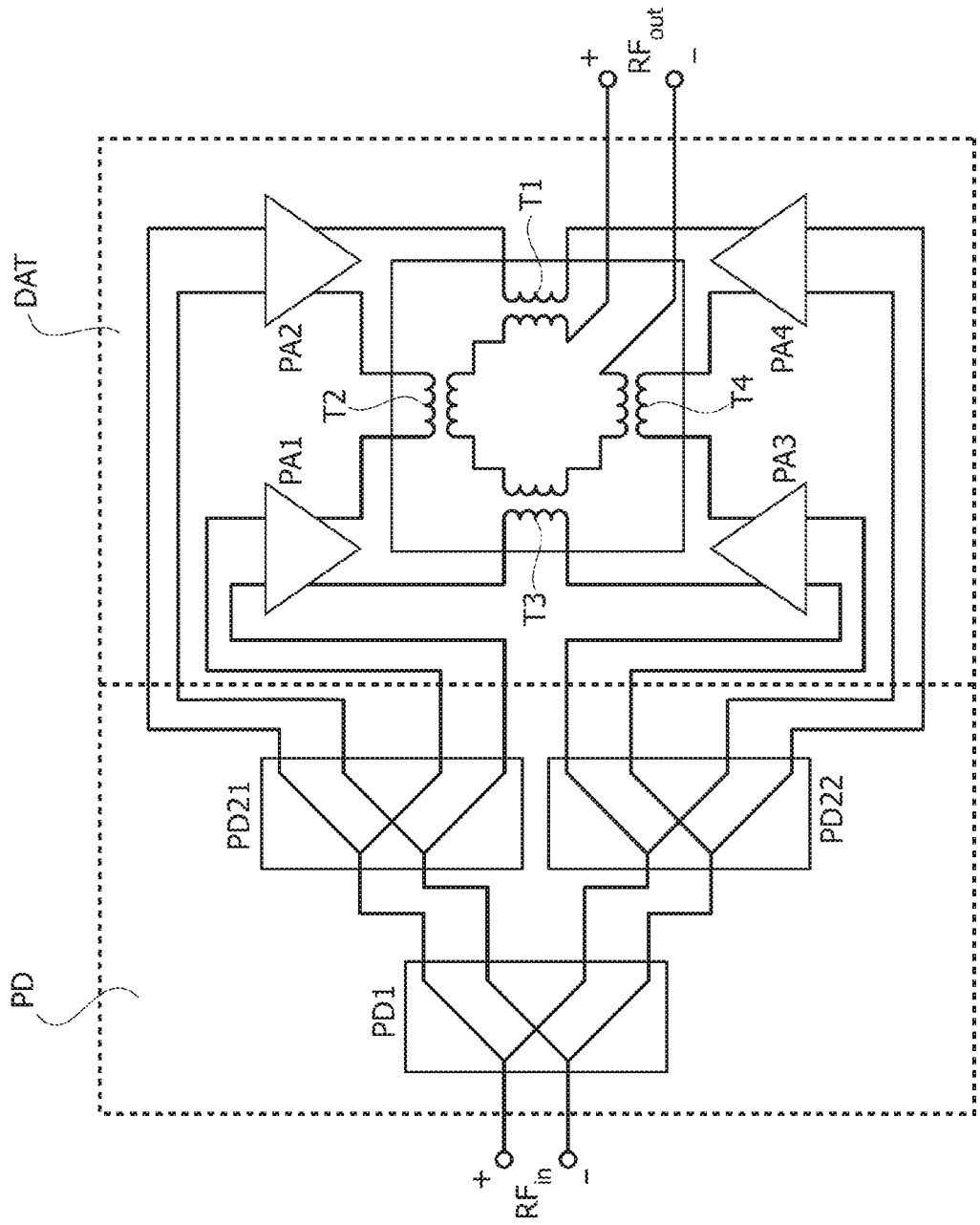
FIG. 2 is exemplary of the possible layout of a power divider in driving an active transformer.

FIG. 2 is exemplary of the possibility of using a so-called Wilkinson power divider PD, including an input divider stage PD1 having two further divider stages PD21, PD22 cascaded thereto to feed a RF input signal $RF_{in}$ to the active stages PA1, PA2, PA3, PA4 of a distributed active transformer DAT (having a layout different from the layout exemplified in FIG. 1), including four transformers T1, T2, T3, T4 to produce a RF output signal $RF_{out}$.

A main drawback of such a Wilkinson power divider (which may also be used in a complementary fashion as a power combiner)—and similar structures—may again lie in the large (for example, silicon) area required for their layout: for instance a Wilkinson power divider may take the major portion of the chip area and lead to a significant power dissipation.

One or more embodiments may rely on the recognition that a DAT topology may be implemented using slab transformers, which may facilitate improving efficiency in comparison with conventional transformers based on spiral (coil) inductors. Starting from that recognition, one or more embodiments may exploit a "linear" power splitting and combining architecture as an alternative to the concentric layout disclosed, for example, in U.S. Pat. No. 8,049,564 B1.

Figure 3:
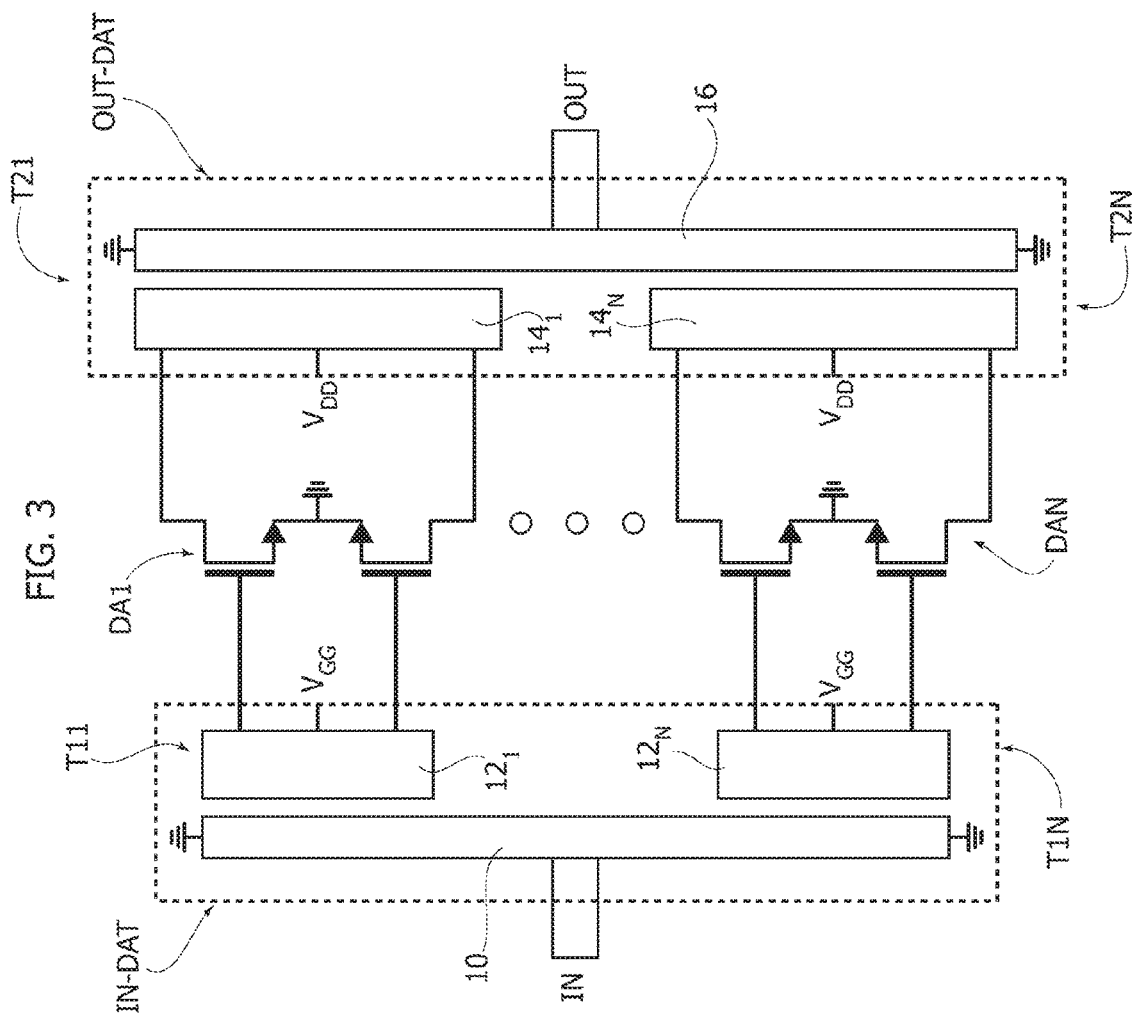
FIG. 3 is an exemplary block diagram of one or more embodiments.
Figure 4:
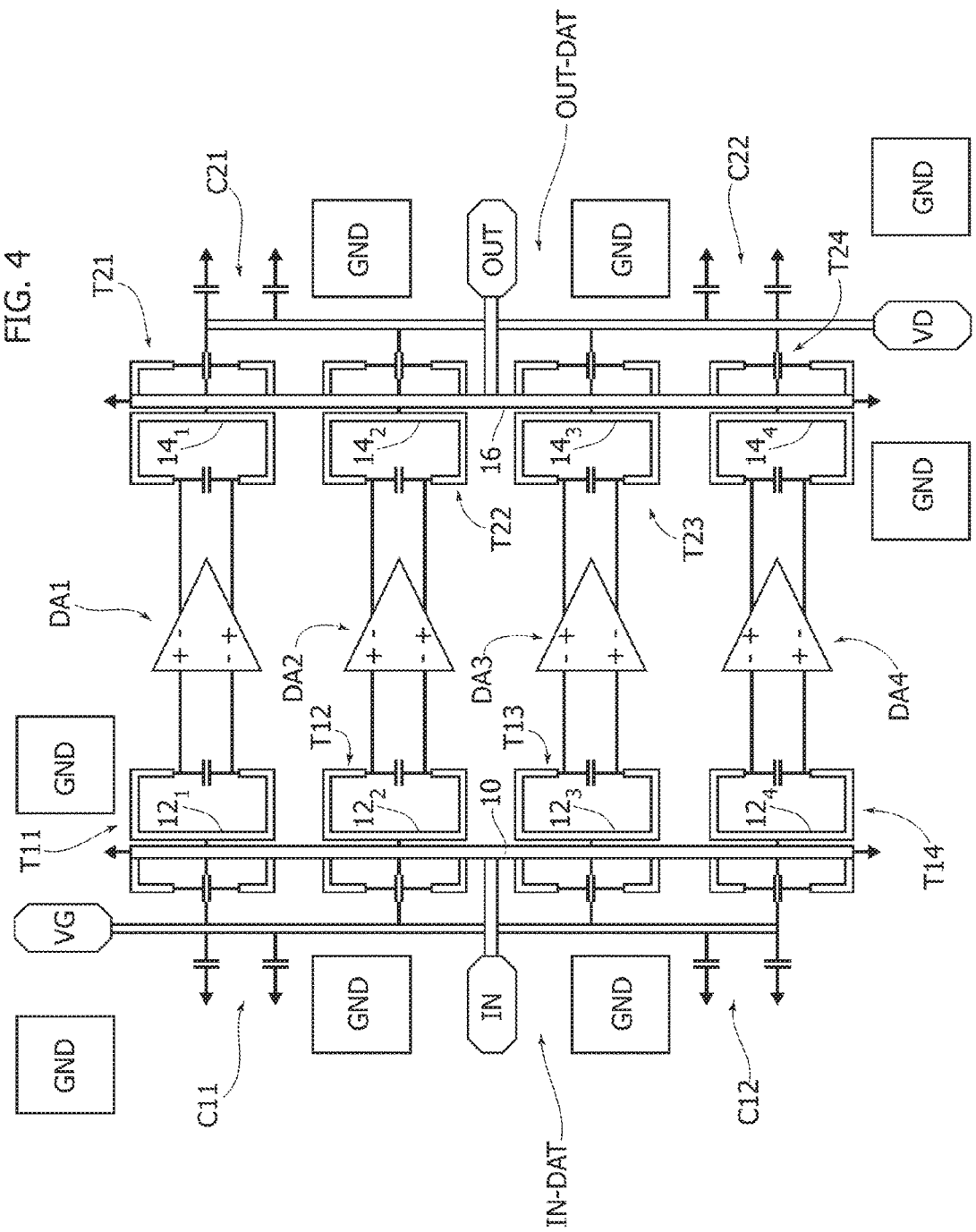
FIG. 4 is a schematic circuit diagram of one or more embodiments.

One or more embodiments may thus include a linearly-aligned slab-based DDAT architecture (L-DDAT) as exemplified in FIGS. 3 and 4.

For the sake of brevity, certain reference signs already appearing in FIG. 1 have been used in FIGS. 3 and 4 in order to designate the basic elements of an active transformer layout, thus making it unnecessary to repeat here a relative description.

With reference to the Aoki, at al. reference (already cited), a transformer-based power combiner including inductor slabs may be easier to optimize for reducing power loss due to metal resistance and impedance mismatching.

Also, while the concentric or coaxial DDAT of U.S. Pat. No. 8,049,564 B1 may involve series-connected power splitting and combining slab transformers, a linear DDAT as exemplified in FIGS. 3 and 4 may involve a mixed combination of series and parallel connected slab transformers. This may result in a higher degree of freedom in the design of the output impedance matching network of the individual uPA cells.

In one or more embodiments of a linear DDAT arrangement as exemplified in FIGS. 3 and 4, an input distributed active transformer IN-DAT (providing the input power splitting function), may include a primary "coil" 10 which may in fact include a single straight (or linear) metal bar or slab having an intermediate (for example, median) signal input port IN.

In one or more embodiments, the IN-DAT primary slab 10 may be (magnetically) coupled to a set of secondary straight (or linear) metal bars or slabs $12_1, \ldots, 12_N$.

In one or more embodiments, these secondary slabs may be in a number N equal to the number of the differential elementary uPA cells.

For instance, in the exemplary implementation of FIG. 4 (as in the DDAT arrangement exemplified in FIG. 1), N=4 so that four secondary slabs $12_1$, $12_2$, $12_3$, $12_4$ may be provided.

In one or more embodiments, the inputs of the (differential) uPA cells DA1, DA2, etc. may be coupled to the two ends of the respective secondary slab segments $12_1$, $12_2$, ..., etc. while the DC bias voltage (VGG in FIG. 3) to the uPA cell transistor pairs may be applied at an intermediate (for example, median) point of the secondary slabs, which may provide an AC ground GND for the uPA input signal (see, for example, the capacitors C11 and C12 in FIG. 4).

As in the case of the DDAT architecture concept of FIG. 1 or U.S. Pat. No. 8,049,564 B1, in one or more embodiments as exemplified in FIGS. 3 and 4, a corresponding output DAT structure, indicated OUT-DAT, may be coupled to the (differential) outputs of the uPA cells DA1, DA2, ..., etc.

For instance, in one or more embodiments a DC bias voltage for each transistor pair (VDD in FIG. 3) may be applied to an intermediate (median) point of a corresponding OUT-DAT straight (or linear) primary slab segment $14_1$, $14_2$, ..., $14_N$, which may provide an AC ground GND for the (differential) output signal of the respective uPA cell (see, for example, the capacitors C21 and C22 in FIG. 4).

Again, each primary slab $14_1$, $14_2$, ..., $14_N$, of the output DAT section, OUT-DAT in FIGS. 3 and 4, may be (magnetically) coupled to the OUT-DAT secondary side which may include a single straight (or linear) metal bar or slab 16.

In one or more embodiments, such a metal bar or slab 16 may produce thus a mixed power combination (MCT) of the output signals form the uPA cells DA1, DA2, ..., etc.

In one or more embodiments, the overall output signal from the L-DDAT power amplifier may be obtained at an intermediate (for example, median) point OUT of the secondary slab 16 of the output DAT, namely OUT-DAT.

In one or more embodiments, a L-DDAT power amplifier arrangement as exemplified in FIGS. 3 and 4 may facilitate simplifying a RF power amplifier and preamplifier circuit and design methodology by resorting an architecture which may be compact and easy to integrate, while also facilitating targeting different power level through a simple modular approach working up to millimeter-wave frequencies.

One or more embodiments may maintain the advantage of mitigating transistor breakdown issues, thus facilitating increasing the delivered output power.

One or more embodiments may offer one or more of the following advantages:

- a mixed power-combining transformer (MCT) may be provided as a combination of series and parallel transformers (SCT+PCT) to facilitate increasing the output signal power by properly adjusting the load resistance;
- increasing output power may be facilitated while staying within the low breakdown voltage limits of silicon-based transistor technologies such as, for example, CMOS and BiCMOS;
- a modular design approach may facilitate increasing the number of power stages;
- a simplified and compact layout may be obtained, reducing area consumption;
- a double DAT configuration may facilitate efficient input signal power splitting;
- a localized electro-magnetic (EM) field in slab transformers may reduce cross-talk and passive Q-factor degradation: slab inductors may in facts outperform single loop inductor in terms of Q-factor;
- cross-connection may be reduced through I/O power distribution (1-way signal path);
- a linear DAT layout is well suited for differential I/O connection;
- using a balanced-unbalanced transformer (balun) may no longer be necessary for single-ended input/output connection;
- transformer-based power dividers may dispense with capacitors for AC coupling;
- low area occupation; and
- output powers in the range of, for example, $P_{1dB} \geq 22$ dBm@84 GHz may be achieved.

One or more embodiments may thus provide a distributed active transformer including an input transformer set (for example, IN-DAT) and an output transformer set (for example, OUT-DAT) and a plurality of active stages (for example, DA1, ..., DAN in FIG. 3 or DA1, DA2, DA3, DA4 in FIG. 4), each active stage being set between a transformer (for example, T11, ..., T1N; T11, T12, T13, T14) in the input transformer set and a transformer (for example, T21, ..., T2N; T21, T22, T23, T24) in the output transformer set, wherein at least one of said input transformer set and said output transformer set may include a slab transformer with a single primary (for example, 10) or secondary (for example, 16) slab coupled with a plurality of secondary (for example, $12_1$, ..., $12_N$; $12_1$, $12_2$, $12_3$, $12_4$) or primary (for example, $14_1$, ..., $14_N$; $14_1$, $14_2$, $14_3$, $14_4$) slabs, respectively.

In one or more embodiments, both of said input transformer set and said output transformer set may include a slab transformer, with:

said input transformer set including a single primary slab (for example, 10) coupled with a plurality of secondary slabs (for example, $12_1$, ..., $12_N$; $12_1$, $12_2$, $12_3$, $12_4$), and said output transformer set including a plurality of primary slabs (for example, $14_1$, ..., $14_N$; $14_1$, $14_2$, $14_3$, $14_4$) coupled with a single secondary slab (for example, 16).

In one or more embodiments, the single primary slab of said input transformer set may include an intermediate signal input port (for example, IN) thereby providing input signal distribution over said plurality of secondary slabs and said plurality of active stages.

In one or more embodiments, the single secondary slab of said output transformer set may include an intermediate signal output port (for example, OUT) thereby providing output signal combination from said plurality of primary slabs and said plurality of active stages.

In one or more embodiments, the active stages in said plurality of active stages may have their inputs coupled to a respective one of said secondary slabs in said plurality of secondary slabs of the input transformer set, optionally with an active stage DC bias voltage (for example, VGG) applied at an intermediate point of said respective one of said secondary slabs in said plurality of secondary slabs.

In one or more embodiments, the active stages in said plurality of active stages may have their outputs coupled to a respective one of said primary slabs in said plurality of primary slabs of the output transformer set, optionally with an active stage DC bias voltage (for example, VDD) applied at an intermediate point of said respective one of said primary slabs in said plurality of primary slabs.

In one or more embodiments, a distributed active transformer as exemplified previously may be implemented as an integrated circuit.

In one or more embodiments, amplifier apparatus (for example, a power amplifier, for example, an integrated circuit—IC RF power amplifier for use in a mobile terminal, for instance) may include a distributed active transformer as exemplified previously.

In one or more embodiments, a method of providing a distributed active transformer may include:
- providing an input transformer set and an output transformer set and a plurality of active stages by setting each active stage between a transformer in the input transformer set and a transformer in the output transformer set, and
- providing at least one, and optionally both, of said input transformer set and said output transformer set including a slab transformer with a single primary resp. secondary slab coupled with a plurality of secondary resp. primary slabs.

Without prejudice to the underlying principles, the details and embodiments may vary, even significantly, with respect to what has been described by way of example only without departing from the extent of protection.

The invention claimed is:

1. A distributed active transformer, comprising:
   an input transformer set comprising a slab transformer with a single primary slab;
   an output transformer set comprising a slab transformer with a single secondary slab; and
   a plurality of active stages with each active stage being set between a transformer in the input transformer set and a transformer in the output transformer set,
   wherein the single primary slab extends between first and second ends that are electrically connected to a ground reference and a first intermediate point between said first and second ends is electrically connected to an intermediate signal input port; and
   wherein the single secondary slab extends between third and fourth ends that are electrically connected to the ground reference and a second intermediate point between said third and fourth ends is electrically connected to an intermediate signal output port.

2. The distributed active transformer of claim 1, wherein:
   the single primary slab of said input transformer set is coupled with a plurality of secondary slabs, and
   the single secondary slab of said output transformer set is coupled to a plurality of primary slabs.

3. The distributed active transformer of claim 2, wherein the active stages in said plurality of active stages have inputs coupled to a respective one of said secondary slabs in said plurality of secondary slabs of the input transformer set.

4. The distributed active transformer of claim 3, wherein an active stage DC bias voltage is applied at an intermediate point of said respective one of said secondary slabs in said plurality of secondary slabs of the input transformer set.

5. The distributed active transformer of claim 2, wherein the active stages in said plurality of active stages have outputs coupled to a respective one of said primary slabs in said plurality of primary slabs of the output transformer set.

6. The distributed active transformer of claim 5, wherein an active stage DC bias voltage is applied at an intermediate point of said respective one of said primary slabs in said plurality of primary slabs of the output transformer set.

7. The distributed active transformer of claim 1, wherein the transformer is implemented as an integrated circuit.

8. The distributed active transformer of claim 1, wherein the distributed active transformer is a component of an amplifier apparatus.

9. A distributed active transformer, comprising:
   an input slab transformer comprising a single primary straight bar and a plurality of secondary straight bars arranged parallel to said single primary straight bar of the input slab transformer for magnetic coupling, wherein the single primary straight bar has first and second ends electrically connected to ground and a first intermediate point between the first and second ends electrically connected to receive an input signal;
   a plurality of active stages, wherein each active stage includes an input coupled to a corresponding one of said plurality of secondary straight bars of the input slab transformer and further having an output; and
   an output slab transformer comprising a plurality of primary straight bars and a single secondary straight bar arranged parallel to said plurality of primary straight bars of the output slab transformer for magnetic coupling, wherein each primary straight bar of the output slab transformer is coupled to an output of a corresponding one of said plurality of active stages, and wherein the single secondary straight bar has third and fourth ends electrically connected to ground and a second intermediate point between the third and fourth ends electrically connected to generate an output signal.

10. The distributed active transformer of claim 9, wherein an active stage DC bias voltage is applied at an intermediate point of each of said plurality of secondary straight bars in said input slab transformer.

11. The distributed active transformer of claim 9, wherein an active stage DC bias voltage is applied at an intermediate point of each of said plurality of primary straight bars of the output slab transformer.

12. The distributed active transformer of claim 9, wherein the transformer is implemented as an integrated circuit.

13. The distributed active transformer of claim 9, wherein the distributed active transformer is a component of an amplifier apparatus.

* * * * *